(12) United States Patent
Dionne et al.

(10) Patent No.: US 11,994,472 B2
(45) Date of Patent: May 28, 2024

(54) SUB-WAVELENGTH RAMAN IMAGING WITH COMBINED OPTICAL AND ELECTRON EXCITATION

(71) Applicant: The Board of Trustees of the Leland Stanford Junior University, Stanford, CA (US)

(72) Inventors: Jennifer A. Dionne, Menlo Park, CA (US); Amr Ahmed Essawi Saleh, Palo Alto, CA (US); Daniel K. Angell, San Francisco, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 288 days.

(21) Appl. No.: 17/629,697

(22) PCT Filed: Jul. 24, 2020

(86) PCT No.: PCT/US2020/043561
§ 371 (c)(1),
(2) Date: Jan. 24, 2022

(87) PCT Pub. No.: WO2021/021656
PCT Pub. Date: Feb. 4, 2021

(65) Prior Publication Data
US 2022/0268704 A1    Aug. 25, 2022

Related U.S. Application Data

(60) Provisional application No. 62/879,151, filed on Jul. 26, 2019.

(51) Int. Cl.
*G01N 21/65* (2006.01)
*G01J 3/44* (2006.01)

(52) U.S. Cl.
CPC ............... *G01N 21/65* (2013.01); *G01J 3/44* (2013.01); *G01N 2021/655* (2013.01)

(58) Field of Classification Search
CPC ........... G01N 2021/655; G01N 21/65; G01N 21/658; G01J 3/44
See application file for complete search history.

(56) References Cited

U.S. PATENT DOCUMENTS

| 5,811,804 A | 9/1998 | Van Blitterswijk et al. |
| 9,431,211 B2 | 8/2016 | Sharma |

(Continued)

OTHER PUBLICATIONS

Kumar et al., "Ultrafast Response of Plasmonic Nanostructures", 2016, Ultrafast Response of Plasmonic Nanostructures. In: Geddes C. (eds) Reviews in Plasmonics 2015. Springer.

(Continued)

*Primary Examiner* — Hina F Ayub
(74) *Attorney, Agent, or Firm* — LUMEN PATENT FIRM

(57) ABSTRACT

Improved stimulated Raman spectroscopy is provided by replacing the Stokes (or anti-Stokes) optical source with a localized electromagnetic emitter that is excited with a non-electromagnetic excitation. Such a localized emitter can be an efficient Stokes (or anti-Stokes) source for stimulated Raman spectroscopy, and can also provide deep sub-wavelength spatial resolution. In a preferred embodiment, an electron beam from an electron microscope is used to excite the localized emitter. This provides combined Raman imaging and electron microscopy that has the two imaging modalities inherently registered with each other.

13 Claims, 9 Drawing Sheets

(56) References Cited

U.S. PATENT DOCUMENTS

| | | | |
|---|---|---|---|
| 2005/0110990 A1* | 5/2005 | Koo | G01N 21/658 |
| | | | 356/301 |
| 2015/0009489 A1* | 1/2015 | Mulders | H01J 37/28 |
| | | | 356/72 |
| 2015/0262784 A1 | 9/2015 | Hoogenboom | |
| 2017/0221675 A1 | 8/2017 | Hoogenboom | |

OTHER PUBLICATIONS

Ozeki et al., "Multicolor Stimulated Raman Scattering Microscopy With Fast Wavelength-Tunable Yb Fiber Laser", 2019, IEEE Journal of Selected Topics in Quantum Electronics, vol. 25, No. 1.

Wei et al, "Electronic Preresonance Stimulated Raman Scattering Microscopy", 2018, J. Phys. Chem. Lett. 9, 4294-4301.

Fischer et al., "Invited Review Article: Pump-probe microscopy", 2016, Review of Scientific Instruments 87, 031101.

Dionne et al., "The Light Years: Combined optical and environmental electron microscopy to visualize dynamic photochemical processes with atomic-scale resolution", downloaded Jun. 2019.

\* cited by examiner

SUB-WAVELENGTH RAMAN IMAGING WITH COMBINED OPTICAL AND ELECTRON EXCITATION

FIELD OF THE INVENTION

This invention relates to stimulated Raman spectroscopy.

BACKGROUND

Electron microscopy can provide subatomic spatial resolution when it comes to imaging of crystalline nanostructures. Modern cryogenic transmission electron microscopes can even image the atomic structures of isolated individual proteins and molecules. However, electron microscopy falls short in identifying and analyzing molecules in more sophisticated samples such as biological samples. In this case, the typical grayscale electron microscopy images of the sample ultrastructure cannot reveal its molecular makeup. On the other hand, Raman spectroscopy is a very powerful technique to identify the molecular contents of a given sample. Nevertheless, the spatial resolution of Raman spectral imaging remains bounded by the diffraction limit of light as with other light-based techniques.

Thus, combining both electron microscopy with Raman spectroscopy could be transformative. With such integration, it would be possible to reveal the ultrastructure of complex samples and simultaneously determine their molecular constituents with the spatial resolution of electron microscopy.

Current state-of-the-art approaches known as correlated light and electron microscopy combine both electron microscopy with optical spectroscopy in a sequential manner. i.e. perform electron microscopy imaging on a sample and then spectrally image the same sample or vice versa. Then, the two images are overlaid. This type of correlated sequential imaging remains very challenging due to the drastically different sample preparation procedures of both the electron microscopy and optical spectroscopy. Moreover, the alignment accuracy of the two images required to achieve precise mapping remains generally impractical. Furthermore, the optical spectral imaging also remains bound by the diffraction limit.

Accordingly, it would be an advance in the art to provide improved Raman spectroscopy, especially in combination with electron microscopy.

SUMMARY

In this work we provide a new technique that enables Raman spectral imaging with sub-diffraction-limited spatial resolution, approaching the atomic scale.

An exemplary embodiment is a method of performing stimulated Raman spectroscopy on a sample. This method includes the steps of: providing optical pump radiation to the sample at a predetermined wavelength, where the sample defines a Raman-shifted wavelength relative to the predetermined wavelength; disposing a localized electromagnetic emitter in proximity to the sample, where the localized electromagnetic emitter has an electromagnetic resonance at the Raman-shifted wavelength; providing a non-electromagnetic excitation to the localized electromagnetic emitter configured to excite an electromagnetic mode of the localized electromagnetic emitter at the Raman-shifted wavelength; and receiving a stimulated Raman signal from the sample.

Preferably, the optical pump radiation is substantially monochromatic (i.e., has a full-width half-maximum linewidth of 1 nm or less). The Raman-shifted wavelength can be less than the predetermined wavelength (anti-Stokes process). Alternatively, the Raman-shifted wavelength can be greater than the predetermined wavelength (Stokes process).

In a preferred embodiment, the non-electromagnetic excitation provided to the localized electromagnetic emitter is periodically modulated, and lock-in detection is employed to improve a signal to noise ratio of the stimulated Raman signal. Then the Raman signal can be recovered at the modulation frequency. The electron beam modulation can be performed using a dedicated hardware module such as electrostatic plates placed along the electron-beam column or it can be performed using existing "beam-shift" and "beam-tilt" functionalities of the electron beam in electron microscopes.

The non-electromagnetic excitation can be provided by an electron beam. Such an electron beam can be provided by an electron microscope, which enables simultaneous electron microscopy and Raman imaging.

The localized electromagnetic emitter can include a cathodoluminescent emitter. The localized electromagnetic emitter can include one or more nanoparticles. Practice of the invention does not depend critically on nanoparticle shape. Suitable nanoparticle shapes include, but are not limited to: spheres and rods. The localized electromagnetic emitter can be chiral, which makes the stimulated Raman signal responsive to chirality of the sample. For example, nanoparticles can be designed to possess certain chirality. When excited with the electron beam, these nanoparticles will produce highly localized chiral optical fields that can be used to perform highly localized Raman optical activity measurements enabling direct probing of local molecular chirality and other fine details of chiral molecular structures.

Instead of using nanoparticles, we can also use cathodoluminescence-active substrates and films. In this case, the cathodoluminescence of the substrate or film would be tuned such that it has a resonance that overlaps with the targeted Raman vibrations.

The electromagnetic resonance of the localized electromagnetic emitter can be a plasmonic resonance. Such a plasmonic resonance can be a dark mode having reduced coupling to far-field radiation. Dark plasmonic modes refer to particular plasmonic resonances that, when excited, can produce highly localized electric field intensities but they can neither be excited by incident optical fields nor can they scatter this light to the far field. However, these modes can be efficiently excited using electron beams. Moreover, in the presence of another scatterer such as a substrate or another nanoparticle, the dark mode can scatter light to far field enabling optical detection. One potential opportunity to reduce the spontaneous Raman background radiation is to design the nanoparticles such that their dark-mode resonance overlaps with the targeted Raman vibrational modes. Since these modes can only be excited with an electron beam and not be excited with incident optical plane waves, all nanoparticles within the optical field will be "Raman-silent" except for the one excited with the electron beam. This will significantly cut the spontaneous Raman background and greatly improves the signal-to-noise ratio. Not only gold and silver nanoparticles, but other alternative materials and radiative nanoparticles can be used.

In a first example, we consider plasmonic-enabled electron-beam stimulated Raman imaging. Conventional stimulated Raman scattering (SRS) imaging typically uses two laser sources: a pump laser and a Stokes probe laser with wavelength longer than that of the pump laser. The spatial resolution is thus limited by the diffraction limit. We have developed a technique where the optical Stokes probe is emulated by the electron beam in the presence of plasmonic gold nanoparticles. Here, the electron beam acts as a highly-localized broadband optical probe with atomic spatial resolution in addition to its primary imaging function in the electron microscope. By tuning the size of the nanoparticles, their resonant wavelength can be aligned such that it matches the targeted Stokes probe. Notably, these resonances can be excited using the electron beam producing highly confined Stokes light within few nanometers of the particle. Consequently, in the presence of pump laser illuminating the sample in the electron microscope, the local stimulated Raman signature of the molecules around the nanoparticle are locally probed. In this case, the spatial resolution is limited by the electron beam and the nanoparticle hotspot size which is typically few nanometers. This is done while the electron beam is directly imaging the sample. It is worth noting that these nanoparticles are generally used to stain biological samples for electron microscopy to improve contrast of targeted area on the sample. More generally, this basic idea is expected to be applicable to any pump-probe optical spectroscopy using accelerated particle beam excitation of a nanoparticle or the like to provide a sub-wavelength pump or probe.

Implementation example: We worked with a TEM (transmission electron microscope) holder with optical coupling functionality that is designed to perform Cathodoluminescence (CL) imaging (The Vulcan holder from Gatan). The holder is commercially available from Gatan and was the result of a collaboration between our group and Gatan. Unlike regular TEM holders, this holder uses two optical fiber probes coupled to two parabolic mirrors located at the sample. This setup allows for collecting the light emitted from the sample upon electron beam excitation. For our electron-beam stimulated Raman imaging technique we use one of the optical probes to illuminate the sample with the pump laser and the other probe to collect the light scattered from the sample. To facilitate Raman spectroscopy without being overwhelmed by the fluorescence background from the optical fibers, we use custom-built optical fibers with optical filters integrated at the fiber tips; a laser-line filter at the pump fiber tip and a low pass filter at the collection fiber tip. Using these custom fibers, we were able to reduce the background by more than order of magnitude, thus improving the signal-to-noise ratio.

Applications: This technique introduces a new electron microscopy imaging mode which can be integrated with currently available transmission electron microscopes (TEMs), scanning electron microscopes (SEMs) and other instruments with electron beam imaging capabilities. This new imaging mode can be used for label-free molecular and chemical mapping of biological and solid-state samples. It can be used to characterize optical and chemical processes at the nanoscale for photocatalysis and energy storage process among other crucial applications. This approach can be used for both Stokes, anti-Stokes, Raman optical activity, and IR vibrational spectroscopy.

Further applications include:
1) Probing local temperature—By measuring the changes in the localized Stokes/anti-Stokes Raman signals, we can measure the local temperatures and the heating with high spatial resolution.
2) Raman spectral tomography—Raman spectra tomograms can be constructed for 3D objects such as cells with nanoparticles both at the cell surface and nanoparticles inside the cell by performing the measurements at different angles.
3) Measurements in liquid cells—Electron microscopy can be also performed on samples encapsulated in liquid cells. In this case, samples can be incubated in a dispersion of nanoparticles that will enhance the Raman signatures locally. It will also enable probing the molecular changes of the sample when the local environment is altered.

Our technique offers two key advantages that no other available system offers: Raman spectral imaging with spatial resolution approaching that of the electron-beam and simultaneous light and electron beam imaging for perfect imaging correlation. Besides, it doesn't require the development of a new costly electron microscopy system as it can be integrated with systems already in use in various facilities. Currently, there is no other technique that offers Raman spectral imaging in a TEM or SEM with the spatial resolution approaching that of the electron beam. Both WiTec (Rise Raman SEM) and TESCAN offers an SEM with integrated Raman spectroscopy capability by physically moving the sample between two imaging positions in a sequential manner. This is a purely optical measurement and thus the spatial resolution is limited by the diffraction limit in addition to the challenges associated with image alignments.

DETAILED DESCRIPTION

I) Introduction

Figure 1A:
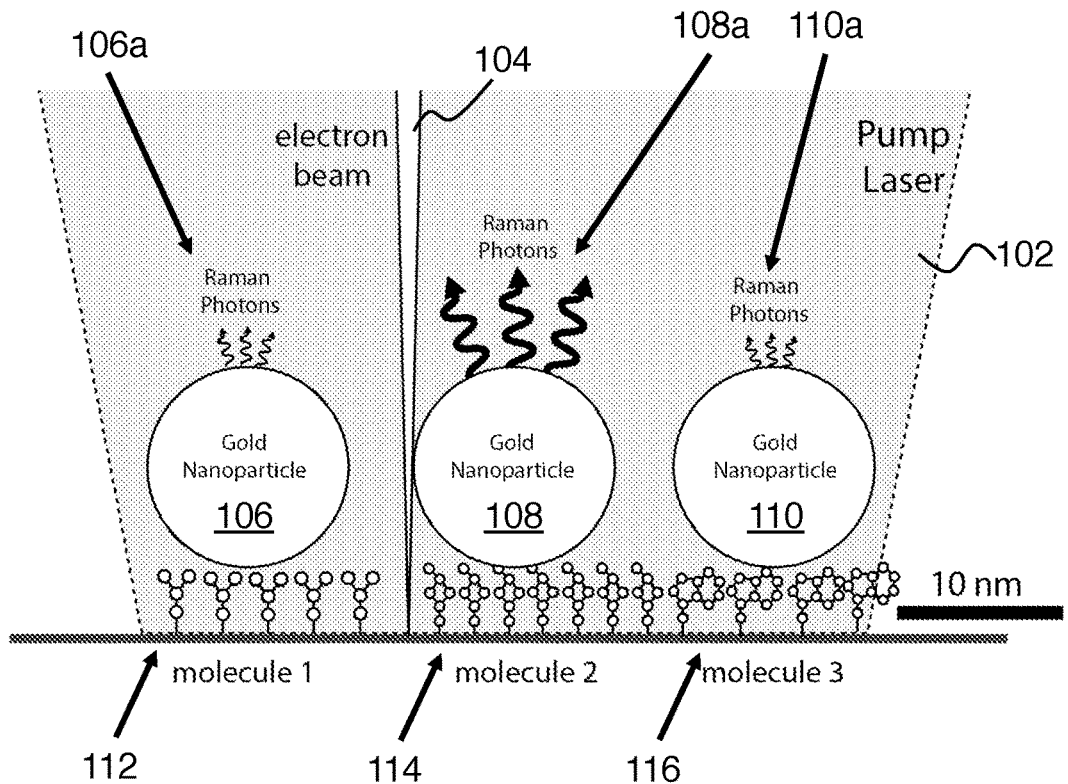
FIG. 1A shows physical principles relating to embodiments of the invention.

Both electron microscopy and Raman spectroscopy have proven to be instrumental characterization tools for high spatial resolution and high molecular specificity, respectively. Modern electron microscopy provides atomic-scale spatial resolution spanning cryogenic, in-situ, and in-operando modalities. Unprecedented structure-function relations have been revealed yet the grey-scale images usually lack information about the sample's local chemical and molecular composition. On the other hand, the superb specificity of Raman spectroscopy has enabled chemical characterization and identification of a variety of specimens, spanning single molecules, atomic and molecular monolayers, cells, and tissues. The spectral fingerprint of Raman has also enabled chemical interrogation of food products, pharmaceuticals, agrochemicals, and microplastics.

To bring molecular specificity to electron microscopy, several innovative techniques have been developed, including high-resolution electron energy loss spectroscopy (EELS) and correlated-light and electron microscopy (CLEM). EELS is used to probe the atomic and the chemical composition of a sample by measuring the energy distribution of the accelerated electrons upon interaction with the sample. Since the electron energy loss signal is proportional to the local dielectric constant, it can also be used to probe the optical properties of materials and nanostructures. Most recently, it has become possible to utilize EELS to probe vibrational modes; for example, EELS has been used to probe phonon modes of thin dielectric layers, surface modes of magnesium oxide nanocubes, as well as isotopic shifts in carbon-oxygen stretching modes, all with 6-10 meV spectral resolution. Wide-spread adoption of this technique, however, is challenged by the required high energy resolution, which can be only achieved with advanced electron sources and monochromators, in addition to sophisticated electron detectors and spectrometers. CLEM is another approach to extract molecular information from electron microscopy images, albeit without directly probing molecular vibrations. Here, the sample is first imaged using super-resolution fluorescence microscopy to obtain molecular information, and then imaged with electron microscopy, to locate the molecular constituents within the ultra-structure of the sample. Though this technique can generate remarkable overlaid datasets, it requires nanometer-scale alignment between the electron and optical images as well as challenging and often incompatible sample preparation for both light and electron microscopy.

In this work, we introduce for the first time a novel vibrational spectral imaging technique, termed "electron- and light-induced stimulated Raman (ELISR)" spectroscopy. ELISR combines the molecular specificity and high-efficiency of surface-enhanced stimulated Raman scattering (SRS) with the high spatial resolution of electron microscopy. Unlike typical stimulated Raman spectroscopy which utilizes two lasers as the pump and Stokes beams, we leverage the electron beam as a highly-localized nanoscale light source. Specifically, we utilize cathodoluminescence from plasmonic nanoparticles as the Stokes excitation in the presence of a monochromatic pump laser source as illustrated in FIGS. 1A-C.

FIG. 1A is a schematic of ELISR. This technique replaces the optical Stokes beam typically used in conventional stimulated Raman measurements with a plasmonic nanoparticle (e.g., 108) driven by an electron beam 104. Here the pump beam is referenced as 102, 106 and 110 are other nanoparticles, and 112, 114, 116 are three different molecular species. Raman emission from nanoparticles 106, 108, 110 is referenced as 106a, 108a, 110a, respectively.

Figure 1B:
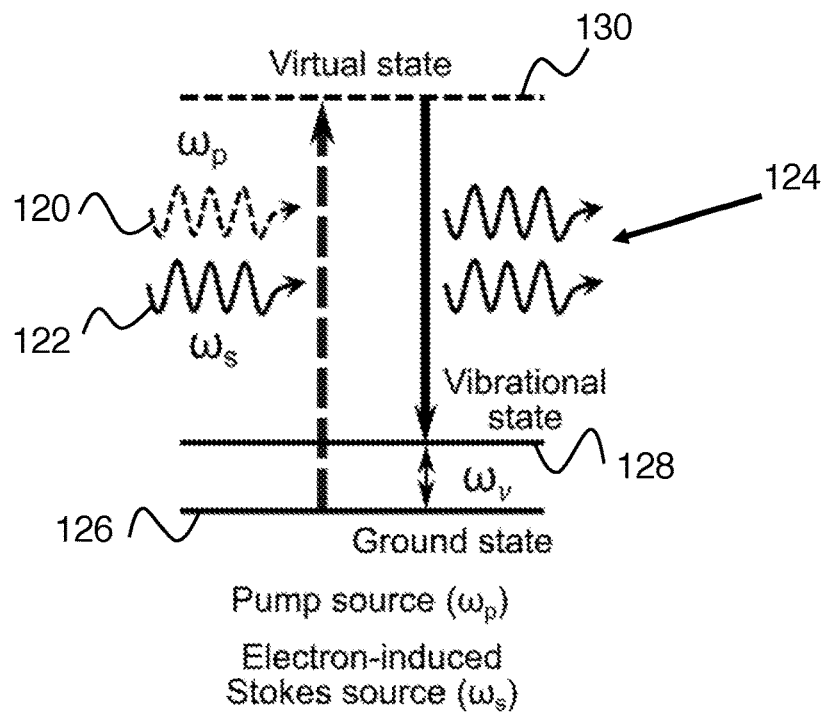
FIG. 1B is an energy level diagram for stimulated Raman scattering.

The nanoparticle size is chosen such that its resonance is red-shifted from the optical pump source to satisfy the stimulated Raman scattering condition as shown in the energy band diagram of FIG. 1B. On this energy level diagram, 126 is the ground state, 130 is a virtual state, 128 is a vibrational state, 120 is the incident pump radiation, 122 is the incident Stokes radiation, and 124 is the stimulated Stokes radiation.

Figure 1C:
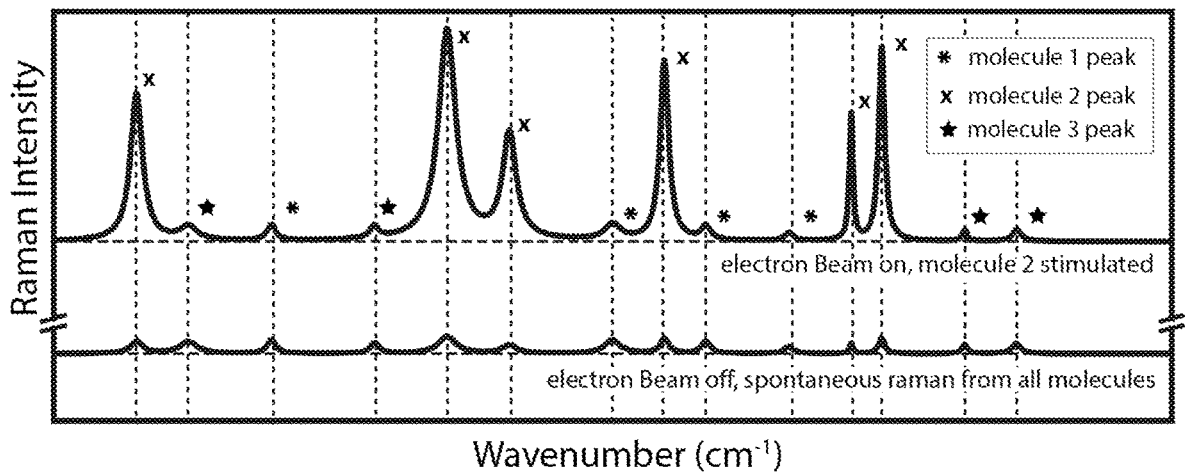
FIG. 1C shows schematic Raman spectra relating to the example of FIG. 1A.

FIG. 1C shows illustrative spectra for the mapping scheme of FIG. 1A. In the absence of the electron beam excitation, the Raman scattering from all illuminated molecules contributes to the spectra, prohibiting spatial localization below the diffraction limit (bottom illustrative spectrum). When the electron beam excites the plasmonic mode of one of the nanoparticles (e.g., nanoparticle 108), the Raman scattering from the surrounding molecules is significantly enhanced while the scattering from the other molecules around unexcited nanoparticles (e.g., nanoparticles 106 and 110) remain unchanged (top illustrative spectrum). Therefore, the molecular composition of a sample can be mapped with nanometer resolution.

To serve as the Stokes excitation, the plasmon resonance is tuned to be red-shifted from the pump laser. By utilizing an electron beam as the primary excitation source of the plasmonic nanoparticle, it is possible to perform high resolution spectral imaging. When an electron beam excites a nanoparticle, only the molecules residing within the near field of this particular nanoparticle undergo stimulated Raman scattering while other molecules only show spontaneous Raman scattering (FIG. 1C). By selectively exciting individual nanoparticles using the electron beam, it becomes possible to probe the local Raman signatures of a sample with a spatial resolution determined by the mode volume of the plasmon and excitation extent of the electron beam. Consequently, ELISR has the potential to enable simultaneous electron imaging with sub-diffraction-limited Raman spectral mapping. To characterize the ELISR technique, we use full-field calculations to study metallic nanorods and nanospheres decorated with Raman-active media as model systems.

II) ELISR Modeling and Numerical Calculations

In general, Raman scattering from a polarizable material, such as a molecule, can be modeled through the dynamic modulation of its polarizability. To analyze the ELISR mechanism, we investigate the interplay between this dynamic modulation and both the pump and the Stokes fields. We are specifically interested in studying how the scattered fields are altered by the presence of such polarizability modulation. Here, the molecular polarizability can be written as $\alpha=\alpha_0+(\partial\alpha/\partial q)_0 \, q(t)$, where $\alpha_0$ is the equilibrium polarizability and $q(t)$ is the internuclear displacement, which can be described as a simple harmonic oscillator dynamically modulated by an external force. In the presence of an external electromagnetic field E, the total force driving the vibrational mode of the molecule can be expressed as $$F = \frac{1}{2}(\partial\alpha/\partial q)|E|^2.$$

For stimulated Raman scattering, the molecule experiences an optical pump field $E_p$ with frequency $\omega_p$ and a Stokes field $E_s$ with frequency $\omega_s$. At resonance, the difference between these two frequencies $\omega_p-\omega_s$ equals the frequency of the molecule vibrational mode $\omega_v$. Under this resonance condition, the driving force is proportional to $E_p E_s^*$ modulating the overall polarizability of the molecule and leading to coupling between the pump and the Stokes fields. The molecular vibration in this case is expressed as a Lorentzian function $$q(\omega) = (1/m)(\partial\alpha/\partial q)E_p E_s^* / \left(\omega_v^2 - \omega^2 - 2i\gamma\omega\right)$$

where m is the reduced nuclear mass.

In a medium with molecular density of N, the polarization can be expressed as $$P(t) = N\alpha(t)E(t) = N\left[\alpha_0 + \left(\frac{\partial \alpha}{\partial q}\right)q(t)\right]E(t) \quad (1)$$

This modulation of molecular polarizability is reflected in the material's optical scattering, which can be determined from Maxwell's equations via:

$$\nabla^2 E(t) - \frac{1}{c^2}\frac{\partial^2 E(t)}{\partial t^2} = \frac{4\pi}{c^2}\frac{\partial^2 P(t)}{\partial t^2} \quad (2)$$

We note that in the absence of the molecular vibration q(t), the second term of the polarization (Eq. 1) vanishes and there will be no coupling between the pump and the Stokes fields. On the other hand, when this molecular vibration is present, the coupling between the two fields is achieved. In this case, the polarizability can be alternatively expressed as $$P = N[\alpha_0 + \chi_R E_p^* E_s]E$$

where $\chi_R$ is the Raman susceptibility of the material which is directly related to the molecular vibrational mode q(t).

Thus, assuming an $e^{-i\omega t}$ time dependence of the field, the wave equation of the Stokes field at frequency $\omega_s$ can be written as:

$$\nabla^2 E_s(\omega_s) - \frac{\omega_s^2}{c^2}(1 + 4\pi N\alpha_0 + 4\pi \chi_R |E_p|^2)E_s(\omega_s) = 0 \quad (3)$$

Figure 2A:
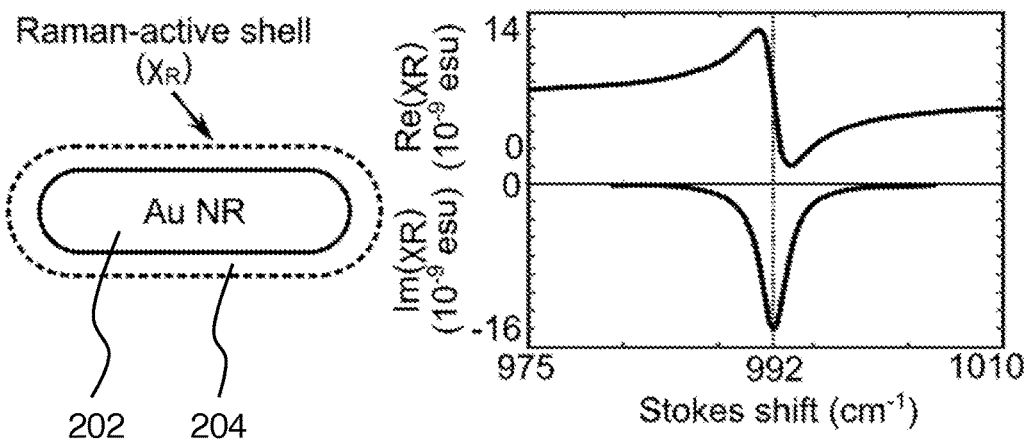
FIGS. 2A-C show Raman scattering results for a coated nanorod.

Eq. 3 indicates that an incident Stokes field can be amplified in the presence of a Raman active material. In this case, the Raman gain can be modeled as the change of the material permittivity under an optical pump as $\varepsilon = \varepsilon_b + 4\pi \chi_R |E_p|^2$. As depicted in FIG. 2A, right side, the Raman susceptibility around a vibrational mode can be described by a Lorentzian function.

In ELISR, the Stokes field $E_s$ exhibits sub-diffraction-limited resolution by leveraging the coherent cathodoluminescence from plasmonic nanoparticles. Plasmonic cathodoluminescence occurs when swift electrons induce local charge oscillations within the nanoparticle, leading to optical radiation. ELISR uses this localized excitation to resemble a confined nanoscale Stokes excitation. Assuming negligible depletion of the optical pump, it is possible to evaluate the amplification of this electron-beam induced Stokes field in two steps following a coupled-wave approach. First, we calculate the enhanced optical pump intensity $|E_p|^2$ inside the Raman active material under plane wave pump excitation, and use this pump intensity to determine the change in the material permittivity. Second, we use this modified material permittivity to calculate the near-field and the far-field scattered from the nanoparticle under electron beam excitation. Using this model, we quantitatively analyze both the Raman gain (hereafter, "gain") and the relative enhancement of the stimulated Raman over the spontaneous Raman scattering (hereafter, "$G_{stim}$"). Raman gain is defined as the amplification of the far field scattering intensity at the Raman peak wavelength; it is calculated as the ratio of the total far field scattering intensity under electron beam excitation with and without the optical pump. The enhancement of the stimulated to the spontaneous Raman scattering, $G_{stim}$, quantifies the role of the electron beam in increasing the number of the Raman photons scattered over the spontaneous Raman scattering. $G_{stim}$ can be calculated as the ratio of the differential stimulated to spontaneous Raman cross sections and is given as:

$$G_{stim} = \frac{32\pi^2 c^2}{\omega_s^2} F(\omega_s) \quad (4)$$

where $F(\omega_s)$ is the Stokes photon flux generated by the electron beam excitation of the plasmonic nanoparticle.

To compute the Raman gain and the Raman enhancement achieved with ELISR, we develop a numerical approach based on the boundary element method (BEM) implemented in Matlab™ (MNPBEM tool-box). As we indicated earlier, calculations are performed in two steps: first we calculate the electric field intensity inside the Raman-active media under plane wave excitation at the wavelength of the pump laser. We use this field intensity to modify the Raman material permittivity accordingly. Second, we use the modified permittivity to calculate the total far field intensity under excitation with the electron beam.

III) Results and Discussion

A. Nanorods as ELISR Labels in the NIR

FIG. 2A shows the first model system we study, which is a metallic gold nanorod 202, which has a diameter of 25 nm and a length of 125 nm, that is coated with a 4 nm Raman-active dielectric layer 204. Here the Raman susceptibility of the dielectric shell shows a Raman peak at 992 cm$^{-1}$. The background dielectric constant of this layer is 2.1 with a Raman response given by the Raman susceptibility ($\chi_R$) shown in FIG. 2A. Such nanorod dimensions are selected so that its plasmonic resonance is red-shifted from the 785 nm Raman pump wavelength.

Figure 2B:
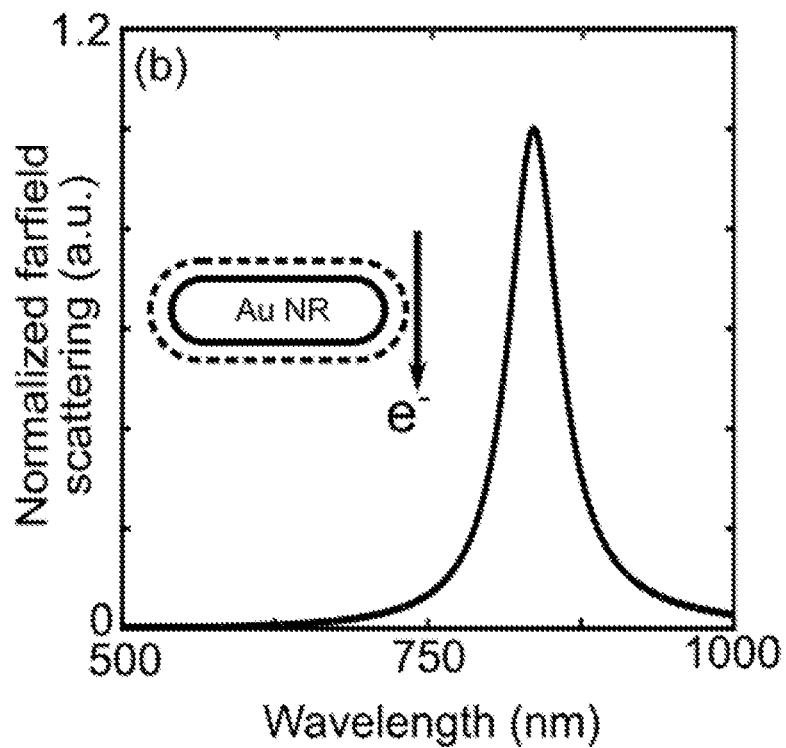
Figure 2C:
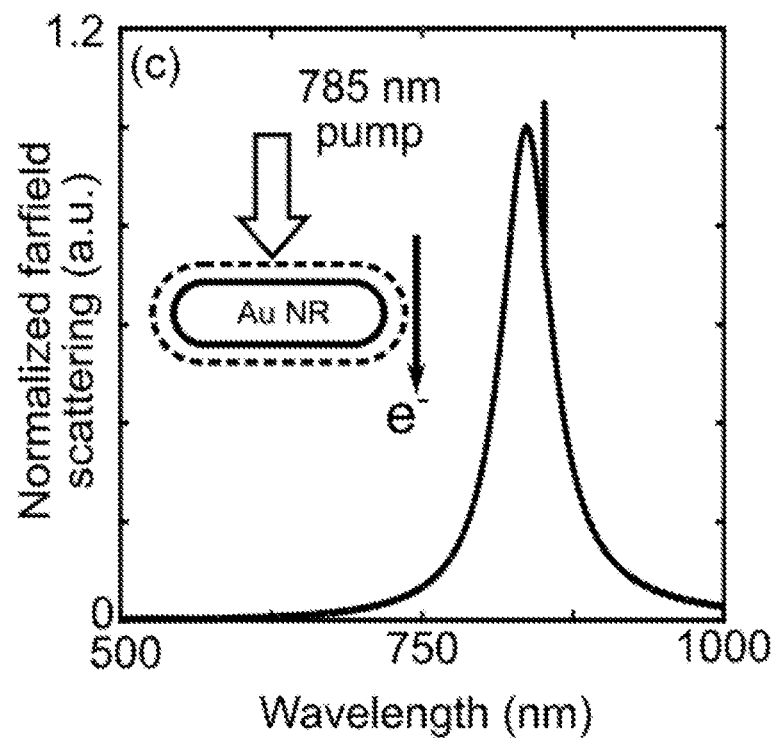

FIG. 2B shows the total far field intensity spectrum when the nanorod is excited with a 1 nA and 80 keV electron beam positioned 2 nm away from the 4 nm dielectric shell; as seen, the nanorod has a resonant peak at 837 nm. FIG. 2C depicts the total far field scattering of the nanorod when a 10 mW/µm$^2$ optical pump excitation at 785 nm is introduced along with the electron beam excitation. Here, the pump beam has introduced noticeable gain into the system at the Raman mode, which manifests itself as a stimulated Raman peak on top of the cathodoluminescence peak at 851 nm, and which corresponds to a 992 cm$^{-1}$ Raman shift from the optical pump.

Figure 3A:
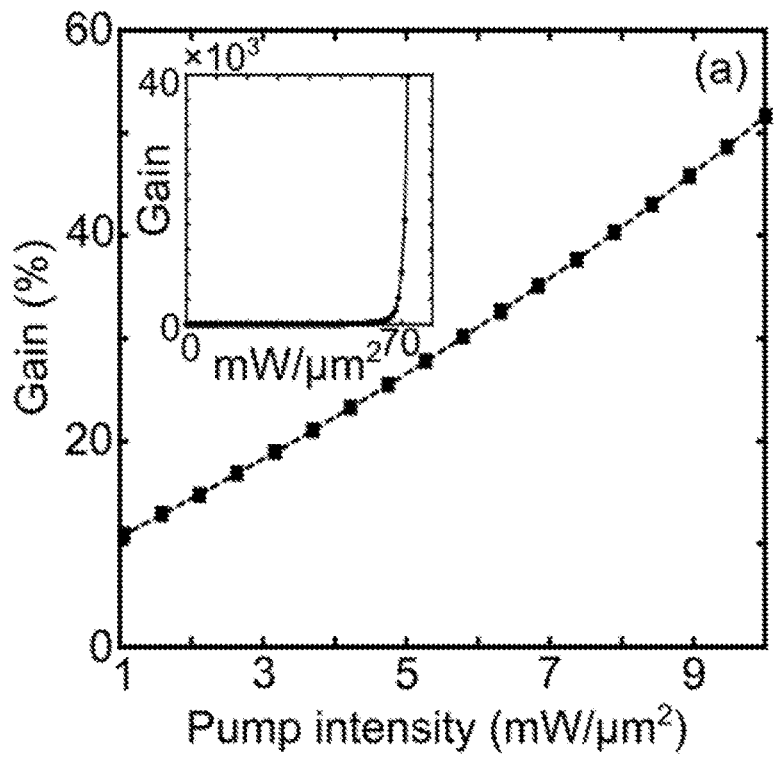
FIGS. 3A-D show further Raman scattering results for a coated nanorod.

To evaluate the Raman gain, we calculate the ratio of the far-field scattering intensity at the Raman mode (851 nm, which is shifted 992 cm$^{-1}$ from the pump) with and without the optical pump, as a function of the pump power. FIG. 3A shows the linear dependence of the gain on the pump power. For the model Raman material we are considering, the figure indicates that even at pump intensities as low as 1 mW/µm$^2$, the Raman gain achieved is approximately 11% and increases to more than 50% at 10 mW/µm$^2$. As shown in the inset, if the system is pumped to even higher powers, it reaches a lasing threshold around 60 mW/µm$^2$.

Figure 3B:
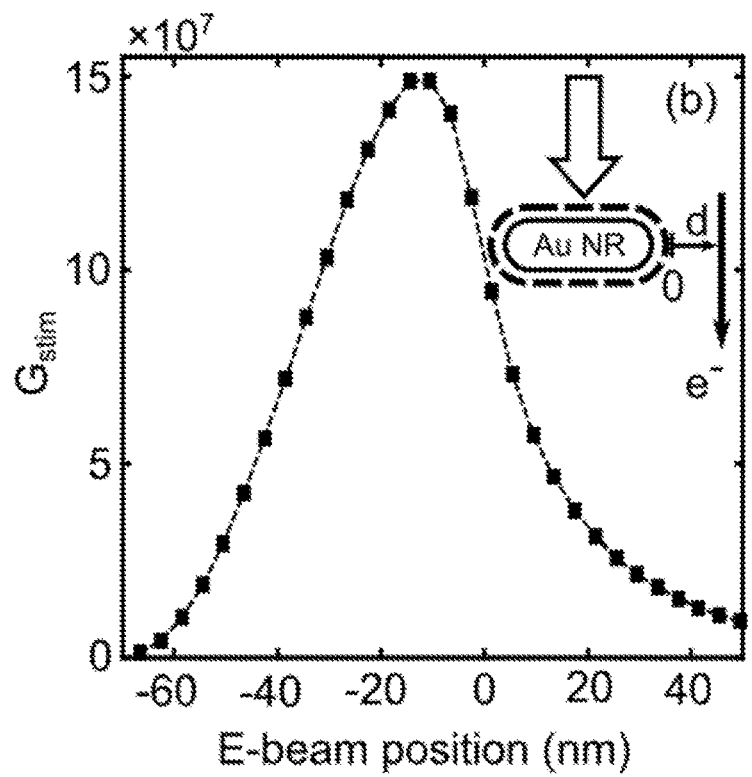

Besides the pump power, the electron beam position can impact generation of the Raman gain signal. As shown in cathodoluminescence and EELS studies, the efficiency of the plasmon mode excitation is specified by the impact position of the electron beam; this efficiency directly impacts the ELISR gain. In FIG. 3B, we demonstrate the importance of the electron beam position on generating Raman gain. The figure plots the enhancement of the stimulated to the spontaneous Raman signal ($G_{stim}$) as a function of the impact position of the electron beam; here, the beam position is measured from the tip of the coated gold nanorod and spans the longitudinal axis. As seen, $G_{stim}$ exhibits a maximum with the electron beam positioned at the metal tip of the rod, where electron-beam coupling to the nanorod plasmon is maximized. This signal decays to half its value by 5 nm away from the dielectric layer, indicating that the spatial resolution of this technique is determined by the coupling efficiency between the electron beam and the nanorod at different electron beam impact positions.

Figure 3C:
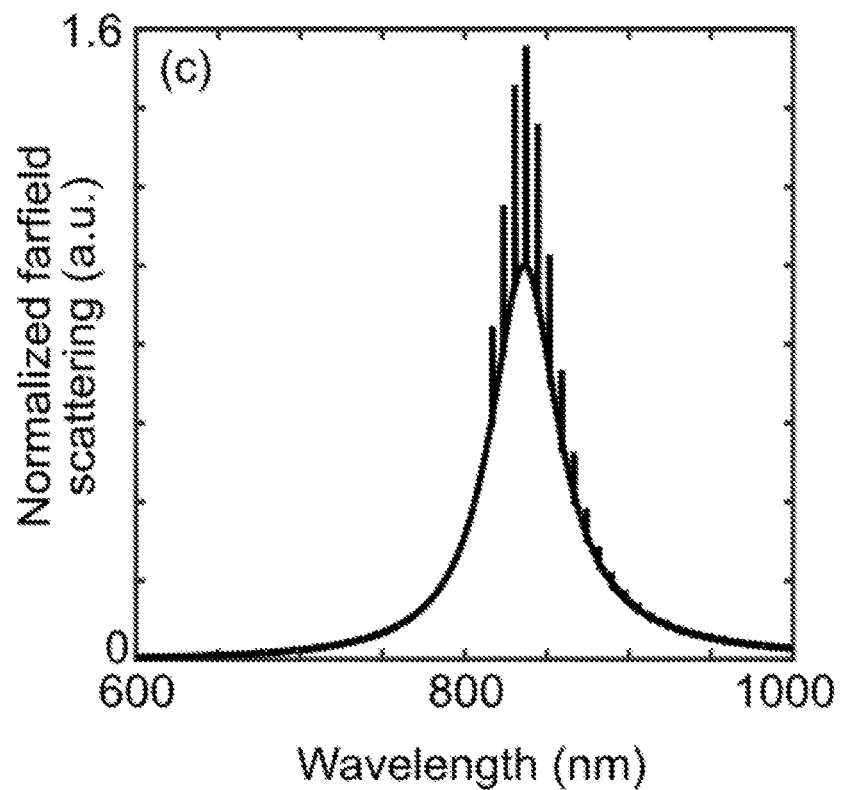
Figure 3D:
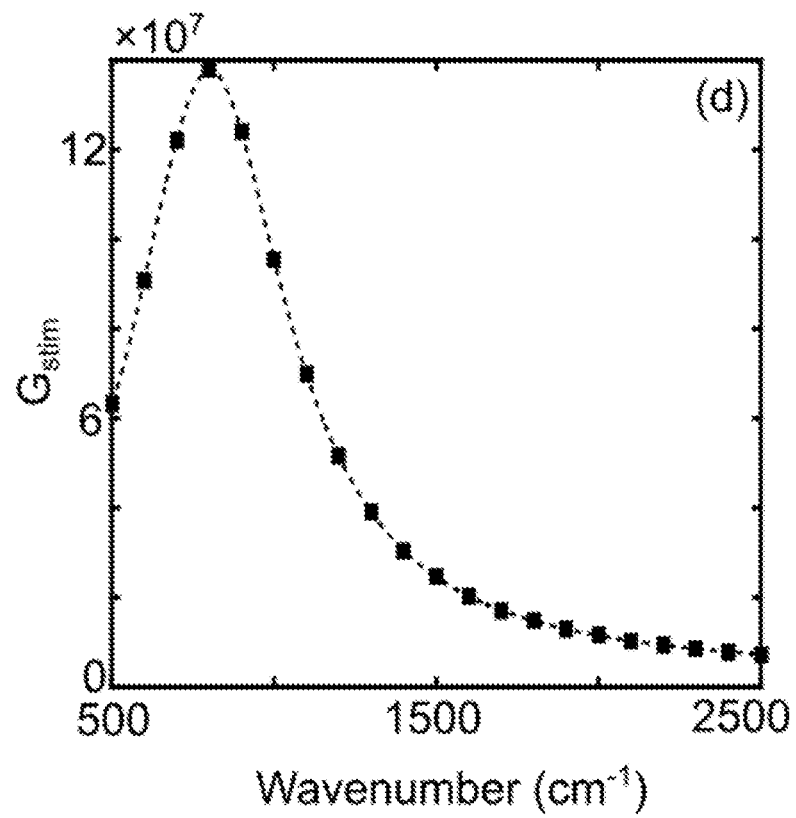

We also investigate the detuning of the Raman mode with that of the nanorod resonance, while keeping the pump beam at 785 nm (see FIGS. 3C-D). As expected, the spectral overlap of the nanorod resonance with that of the Raman mode is crucial. FIG. 3C demonstrates that the strongest peak, and hence the largest Raman gain, occurs when the nanorod resonance is spectrally aligned with the Raman vibrational mode. This effect is also directly reflected in the ratio of stimulated-to-spontaneous Raman signal ($G_{stim}$) shown in FIG. 3D. Therefore, while ELISR can be used for a range of molecules with Stokes shifts that overlap with the plasmon resonance, particular vibrational resonances can be selectively enhanced through spectral tuning of the nanoparticle.

Figure 4:
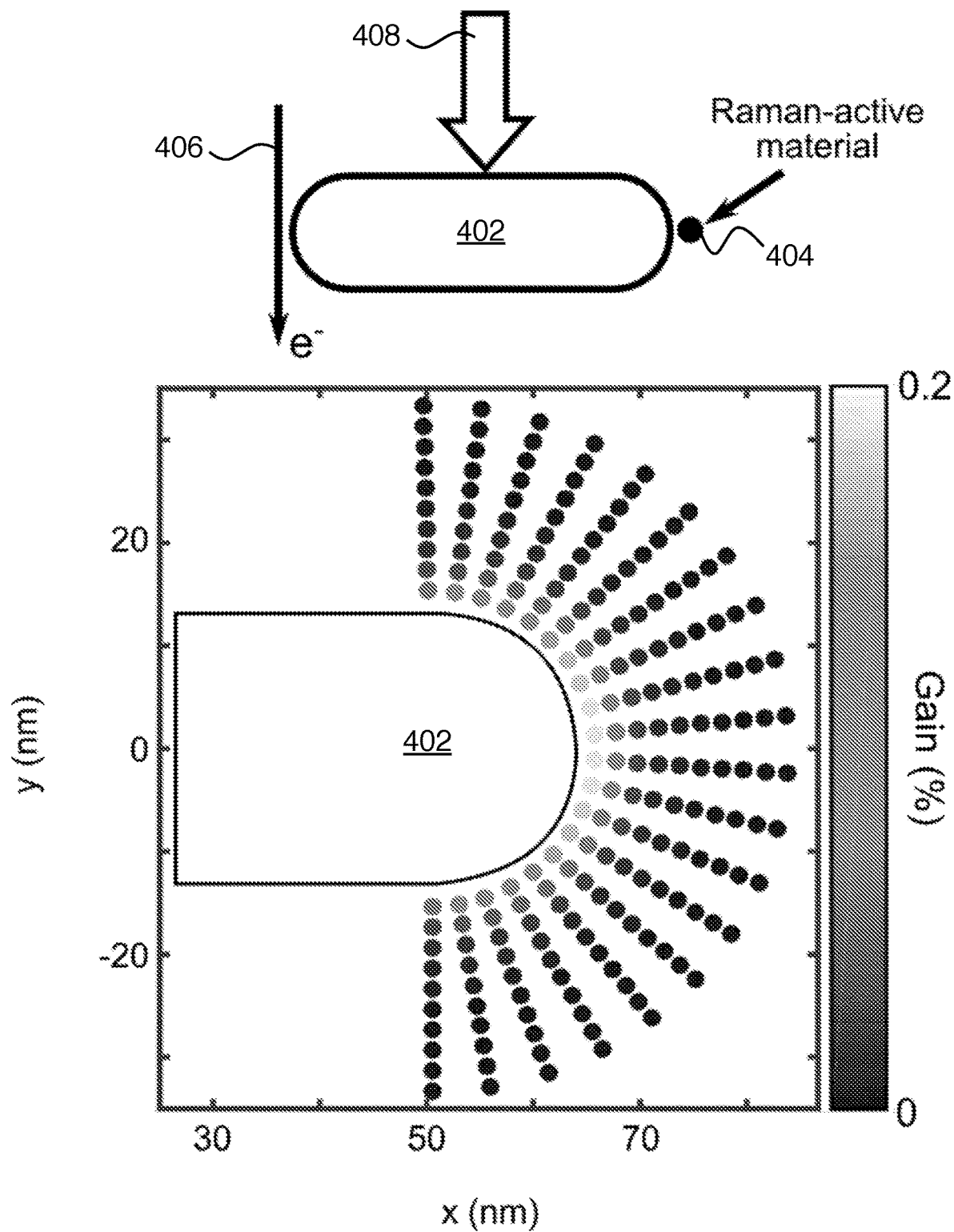
FIG. 4 shows the effect of Raman emitter position (relative to the nanorod) on Raman gain.

The signal from ELISR is also dependent on position of the Raman active material with respect to the nanoparticle. To investigate this dependence, we replace the uniform Raman material shell with a 2-nm diameter sphere of the same Raman-active medium as illustrated in the schematic of FIG. 4 (top). Here 402 is the nanorod, 406 is the e-beam, 408 is the optical pump, and 404 is the 2-nm diameter sphere of the Raman-active medium. We sweep the locations of this sphere in-plane over various positions around the nanorod tip, and calculate the gain achieved at each position. FIG. 4 (bottom) shows the Raman gain, indicating that the gain is maximized when the Raman material is closest to the nanorod tip, and decays to half of its maximum value 5 nm from the tip.

This nanorod analysis highlights two important aspects of ELISR: 1) the nanoparticle geometry and associated mode volume determines the spatial resolution of this e-beam Raman probe; and 2) the nanoparticle resonance dictates the range of pump wavelengths that can be used.

B. Nanospheres as ELISR Labels in the Visible

Figure 5A:
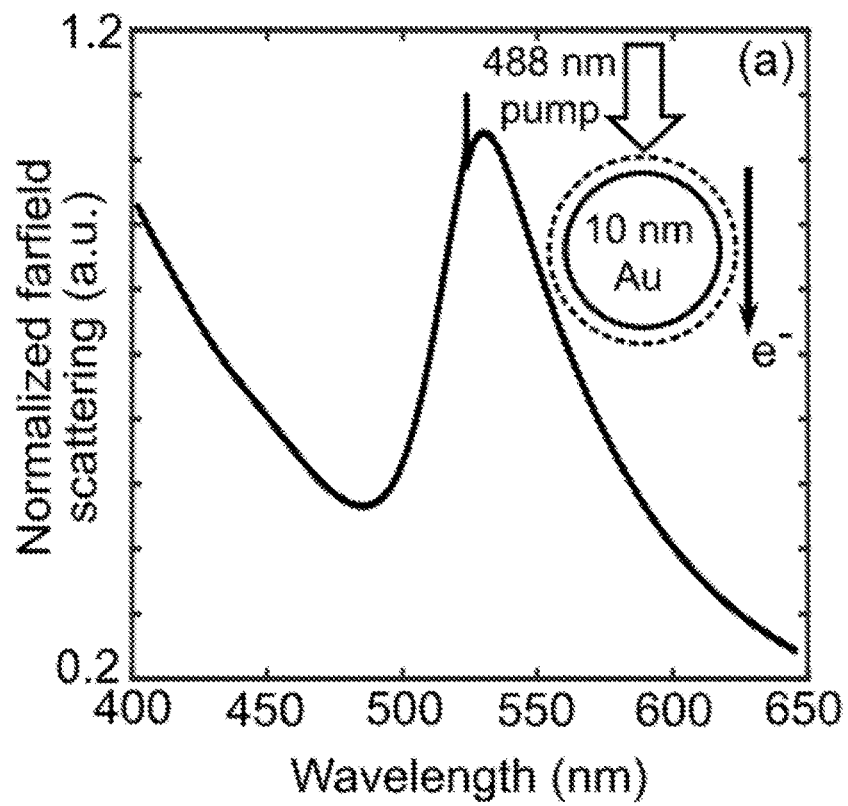
FIGS. 5A-D show Raman scattering results for a coated nanosphere.

Smaller nanoparticle geometries, such as nanospheres, can enable higher ELISR spatial resolution. In this case, a larger number of nanoparticles can be packed on a given sample surface allowing for a larger number of ELISR measurement points per unit area. Indeed, gold nanosphere labeling is already utilized in transmission electron microscopy to improve the contrast of biological samples, making it attractive to investigate the performance of such geometries in ELISR. As an example for such nanospheres, we consider a 10 nm diameter gold nanosphere coated with a 2 nm Raman-active dielectric layer; the Raman susceptibility exhibits a peak at 1400 cm$^{-1}$. As shown in FIG. 5A, the total far field cathodoluminescence scattering intensity spectrum shows a resonance at 530 nm when excited with an electron beam positioned 2 nm away from the nanosphere edge. When a 488 nm pump is introduced concurrent with the electron beam excitation, the Raman peak appears superimposed on the cathodoluminescence, similar to the ELISR results from the nanorod.

Figure 5B:
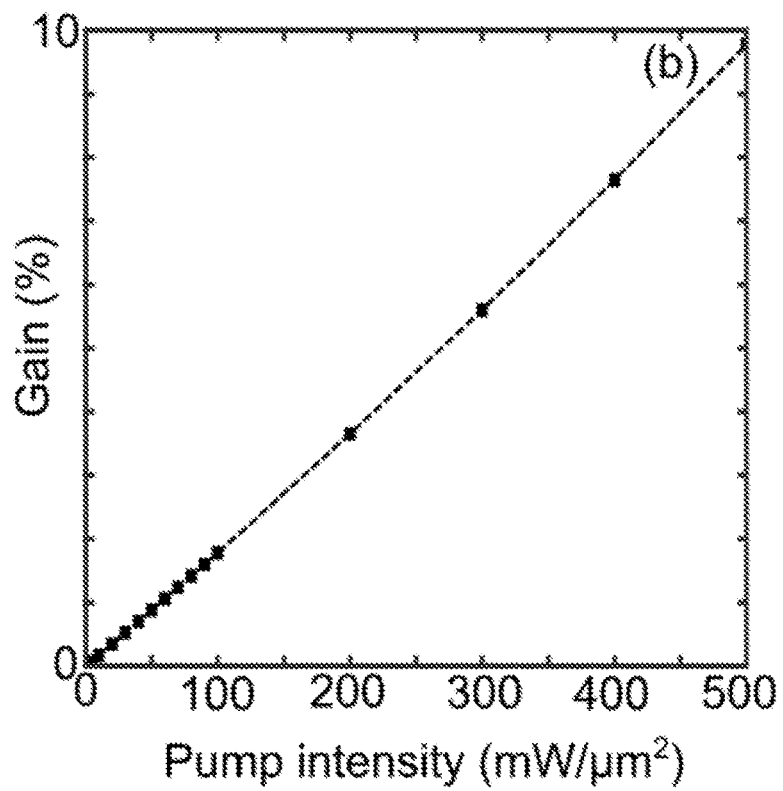

FIG. 5B illustrates the linear dependence between the Raman gain and the pump intensity for the nanospheres, similar to that seen for the nanorods. However, the Raman gain achieved at a certain pump power is reduced compared to that of the nanorod. This reduced gain is because of the reduced extinction cross section of the nanosphere, as well as the smaller effective volume of the Raman active material interacting with the pump. In addition, because of the increased losses in gold at shorter wavelengths, the scattering efficiency from cathodoluminescence is reduced as more energy is lost in the form of heat. Consequently, the stimulated Raman enhancement is reduced by an order of magnitude compared to that of the nanorod.

Figure 5C:
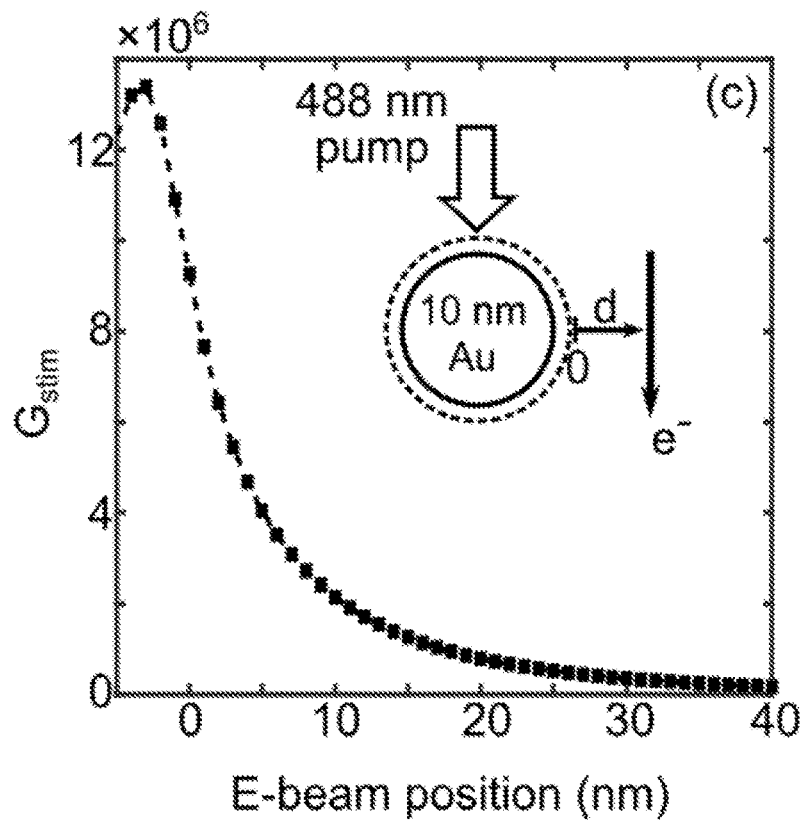
Figure 5D:
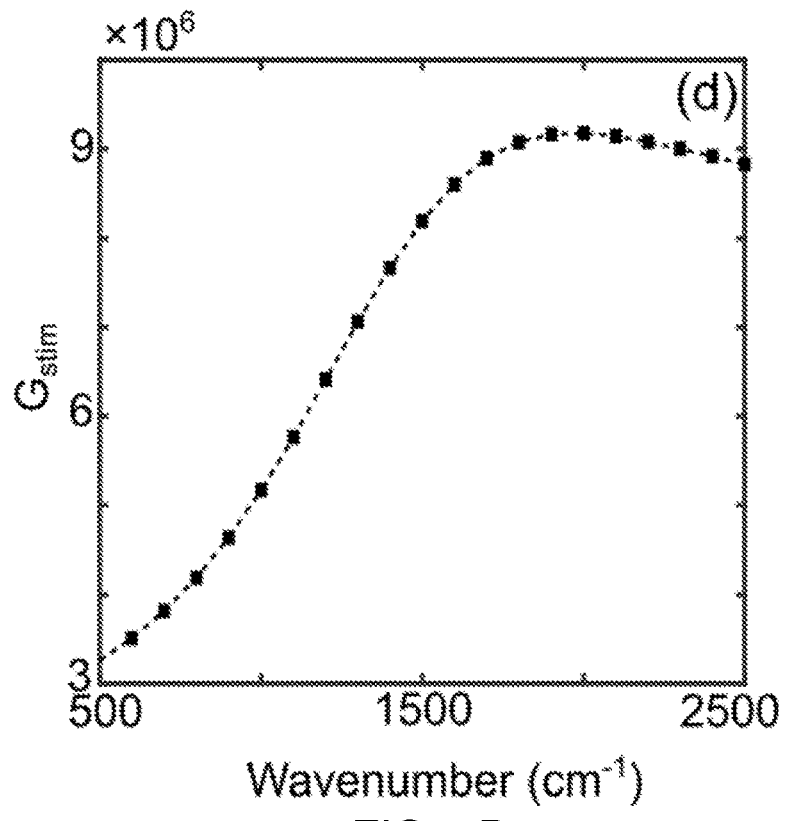

FIG. 5C depicts $G_{stim}$ as a function of electron beam position. Similar to the nanorod, the maximum stimulated Raman enhancement is achieved when the electron beam is positioned right at the metal edge of the nanosphere. This enhancement drops to half of its maximum value when the electron beam is 5 nm away from the nanosphere. The interplay between the nanosphere resonance wavelength and the Raman peak shift wavelength is depicted in FIG. 5D. As expected, and shown with the nanorod geometry, the maximum stimulated Raman enhancement is achieved when the vibrational mode frequency shift matches that of the nanosphere. Interestingly, the enhancement achieved when the vibrational mode is red-shifted from nanosphere resonance is stronger than when the vibrational mode is blue-shifted. This effect is due to the lower losses of the gold at longer wavelengths.

One of the key advantages of using smaller nanoparticles, such as the 10 nm gold spheres studied in this section, is the increased spatial resolution for Raman spectral mapping applications. In such applications, the spatial resolution of the Raman map is determined by the density of nanoparticles that can be dispersed onto the targeted surface. Here, the surface should be covered with a layer of nanoparticles that is dense enough to create as many sampling points as possible over the targeted area while keeping the interparticle distance large enough to avoid signal interference between adjacent particles.

Figure 6:
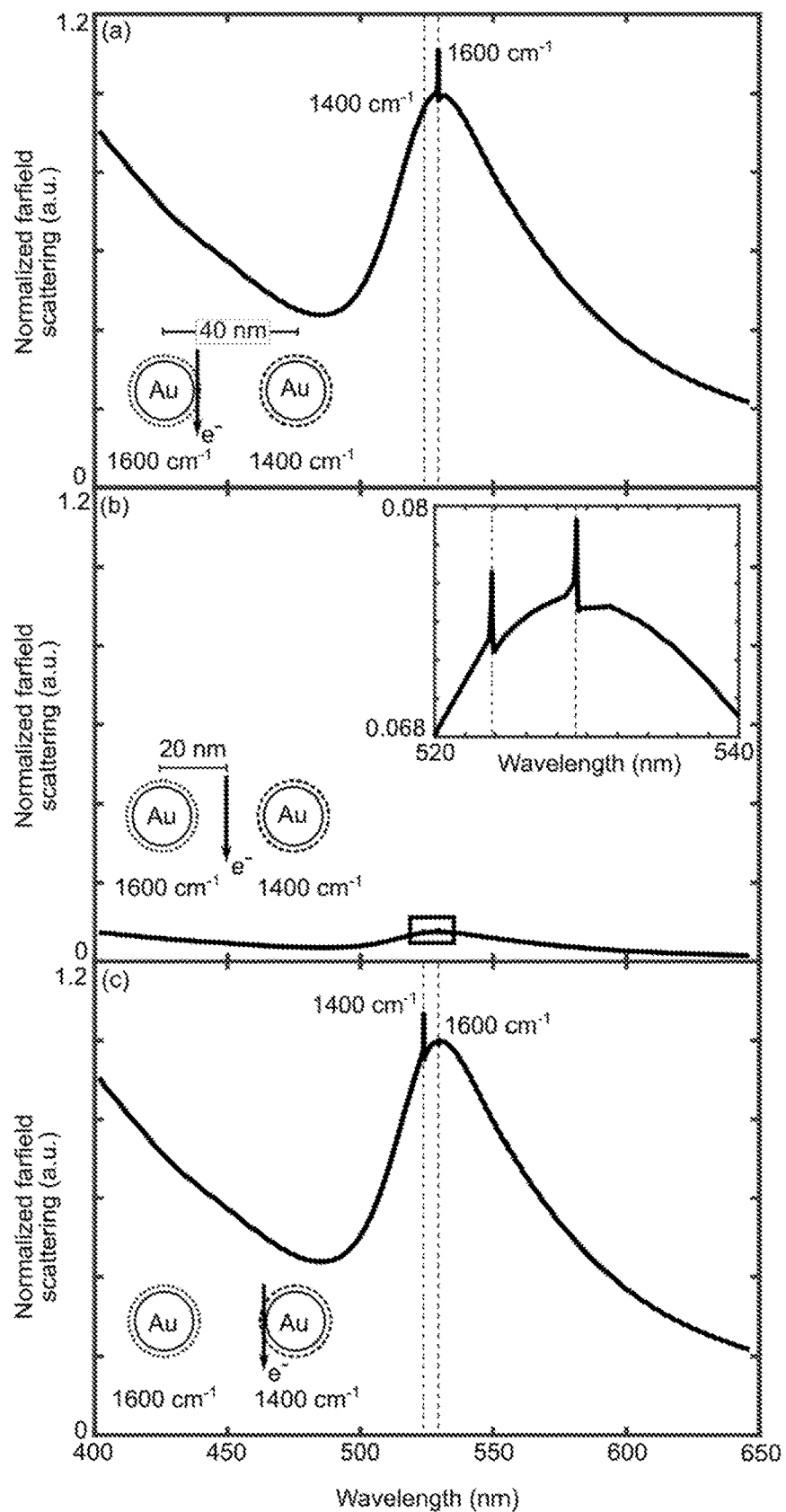
FIG. 6 shows deep sub-wavelength spatial resolution of stimulated Raman scattering provided by coated nanospheres.

To investigate the ELISR imaging resolution, we studied the total far field scattering from two 10 nm nanospheres as depicted in FIG. 6. Each nanosphere has a Raman active material shell with a different Raman peak (1600 cm$^{-1}$ and 1400 cm$^{-1}$) with 40 nm center-to-center particle distance. When the electron beam is positioned at the edge of one of the nanospheres ((a) and (c) of FIG. 6), the corresponding Raman peak is strongly enhanced while the other peak from the other nanosphere is not enhanced. When the electron beam is positioned between the nanospheres, the overall scattering from the two nanospheres is reduced by a factor of 10 and the enhancement of the two peaks is negligible ((b) of FIG. 6). The inset in panel (b) shows the two Raman peaks with a magnifying scale. This result is in agreement with the results shown in FIG. 5C where $G_{stim}$ shows a similar trend with the electron beam position. These results highlight that Raman mapping with at least a resolution of 40 nm can be achieved.

IV) Conclusion

The nanorod and nanosphere highlight the benefits and constraints of ELISR: the nanorod generates both strong nearfields and significant cathodoluminescence, yielding large Raman gain at reasonable pump powers, yet has lower spatial resolution (although still sub-wavelength). On the other hand, the nanosphere promises significantly improved spatial resolution, but requires larger pump powers in order to achieve strong stimulated Raman.

In summary, ELISR promises to enable mapping of vibrational modes at the nanoscale, concurrent with high-resolution structural imaging of the electron beam. Unlike existing methods such as EELS and CLEM, ELISR can be implemented in already available electron microscopes without the need for extreme monochromation of the electron beam, and can provide simultaneous chemical and structural information. By exploring two nanoparticle geometries, we have laid the foundation for the technique's experimental limits and feasibility. We foresee that nanostructures supporting strong field enhancements within nanogaps will provide even larger enhancement in the stimulated Raman gain. Alternate nanostructures can be also utilized to support field enhancements at both the pump wavelength and the targeted Stokes wavelength. Besides achieving strong stimulated Raman gain, such designs could considerably reduce the pump power required to achieve strong Raman gain. Finally, we note that nanostructures supporting chiral cathodoluminescence could be explored to probe the Raman optical activity of chiral molecules.

We anticipate that this ELISR technique could be accessible to any researcher with the ability to couple light into an electron microscope, including scanning and transmission electron microscopes designed for variety of cryogenic, environmental and/or in-situ and in-operando measurements. Therefore, unlike EELS, sophisticated electron spectrometers are not required; however, EELS can also benefit from ELISR to further enhance the Raman signals when the proper tool is available. ELISR should open new opportunities to characterize the local chemical composition of a variety of samples during electron imaging, including two-dimensional materials, polymeric blends, and biological cells and tissues.

The invention claimed is:

1. A method of performing stimulated Raman spectroscopy on a sample, the method comprising:
providing optical pump radiation to the sample at a predetermined wavelength, wherein the sample defines a Raman-shifted wavelength relative to the predetermined wavelength;
disposing a localized electromagnetic emitter in proximity to the sample, wherein the localized electromagnetic emitter has an electromagnetic resonance at the Raman-shifted wavelength;
providing a non-electromagnetic excitation to the localized electromagnetic emitter configured to excite an electromagnetic mode of the localized electromagnetic emitter at the Raman-shifted wavelength; and
receiving a stimulated Raman signal from the sample.

2. The method of claim 1, wherein the optical pump radiation has a full-width half-maximum linewidth of 1 nm or less.

3. The method of claim 1, wherein the Raman-shifted wavelength is less than the predetermined wavelength.

4. The method of claim 1, wherein the Raman-shifted wavelength is greater than the predetermined wavelength.

5. The method of claim 1, wherein the non-electromagnetic excitation provided to the localized electromagnetic emitter is periodically modulated, and wherein lock-in detection is employed to improve a signal to noise ratio of the stimulated Raman signal.

6. The method of claim 1, wherein the non-electromagnetic excitation is provided by an electron beam.

7. The method of claim 6, wherein the electron beam is provided by an electron microscope, whereby simultaneous electron microscopy and Raman imaging is provided.

8. The method of claim 1, wherein the localized electromagnetic emitter comprises a cathodoluminescent emitter.

9. The method of claim 1, wherein the localized electromagnetic emitter comprises one or more nanoparticles.

10. The method of claim 9, wherein a shape of the one or more nanoparticles is selected from the group consisting of: spheres and rods.

11. The method of claim 1, wherein the electromagnetic resonance of the localized electromagnetic emitter is a plasmonic resonance.

12. The method of claim 11, wherein the plasmonic resonance is a dark mode having reduced coupling to far-field radiation.

13. The method of claim 1, wherein the localized electromagnetic emitter is chiral, whereby the stimulated Raman signal is responsive to chirality of the sample.

* * * * *